United States Patent
Moorthy et al.

(10) Patent No.: US 9,054,412 B2
(45) Date of Patent: Jun. 9, 2015

(54) CHANNEL ESTIMATION FILTER NORMALIZATION

(75) Inventors: Hari Moorthy, Piscataway, NJ (US); Wei Luo, Marlboro, NJ (US)

(73) Assignee: Broadcom Corporation, Irvine, CA (US)

( * ) Notice: Subject to any disclaimer, the term of this patent is extended or adjusted under 35 U.S.C. 154(b) by 45 days.

(21) Appl. No.: 13/533,146

(22) Filed: Jun. 26, 2012

(65) Prior Publication Data
US 2013/0259176 A1 Oct. 3, 2013

Related U.S. Application Data

(60) Provisional application No. 61/618,049, filed on Mar. 30, 2012.

(51) Int. Cl.
*H04B 1/10* (2006.01)
*H01Q 1/24* (2006.01)
*H03H 7/40* (2006.01)

(52) U.S. Cl.
CPC ......... *H01Q 1/243* (2013.01); *H03H 7/40* (2013.01)

(58) Field of Classification Search
USPC ........................................................ 375/350
See application file for complete search history.

(56) References Cited

U.S. PATENT DOCUMENTS

| | | | | |
|---|---|---|---|---|
| 2003/0194003 A1* | 10/2003 | Wittig | | 375/229 |
| 2010/0020996 A1* | 1/2010 | Elmedyb et al. | | 381/318 |
| 2010/0295716 A1* | 11/2010 | Yamaki et al. | | 341/155 |

* cited by examiner

*Primary Examiner* — Tanmay Shah
(74) *Attorney, Agent, or Firm* — McDermott Will & Emery LLP

(57) ABSTRACT

Disclosed are various embodiments providing processing circuitry for selecting a channel estimation filter from a plurality of channel estimation filters based on a channel quality metric, the selected channel estimation filter being associated with an intrinsic coefficient. The processing circuitry may then determine a scaled coefficient, the scale coefficient being based on scaling the intrinsic coefficient with respect to a bit size constraint, the bit size constraint being determined by a bit length of a multiplication circuitry operand. Moreover, the processing circuitry may generate an output based on the scaled coefficient and an input signal.

20 Claims, 7 Drawing Sheets

| t | x |
|---|---|
| 0 | 2.7 |
| 1 | 3.5 |
| 2 | 3.3 |
| 3 | 2.6 |
| 4 | -1.9 |
| 5 | -3.7 |
| 6 | -2.7 |

147a

CHANNEL ESTIMATION FILTER NORMALIZATION

CROSS-REFERENCE TO RELATED APPLICATIONS

This application is a utility application that claims priority to co-pending U.S. Provisional Patent Application entitled, "Cellular Baseband Processing", having Ser. No. 61/618,049, filed Mar. 30, 2012, which is entirely incorporated herein by reference.

BACKGROUND

In radio communication, such as those facilitated by cellular networks, the channel characteristics of a signal received by a receiver may vary with time. For example, one channel characteristic may be the noisiness of a channel quantified as a signal-to-noise-power-ratio (SNR). Another channel characteristic may be a Doppler shift, which results from the physical motion of the receiver antenna.

A channel estimation filter may be employed to account for particular channel characteristics of the received signal. Moreover, different channel estimation filters may be selected as channel characteristics change over time.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

The present disclosure relates to selecting an appropriate channel estimation filter (CHEST) and effectively transitioning from a previous CHEST to an updated CHEST. Various channel characteristics may be quantified when making the decision of selecting the most appropriate CHEST. For example, some channel characteristics include an SNR level, a degree of Doppler shift, the selected antenna or antennas chosen to receive a signal and/or any other signal quality metric. Based on an analysis of these various channel characteristics, the most appropriate CHEST may be selected. To this end, each available CHEST may be tailored to a particular range of channel conditions.

A particular CHEST is configured by one or more intrinsic coefficients. Intrinsic coefficients control how a particular CHEST processes an input to generate a filtered output. Furthermore, CHESTS may be implemented using a variety of different filters. For example, a CHESTS may be made up of a finite impulse response filter (FIR), an infinite impulse response filter (IIR) or any other filter type. Thus, a particular CHEST is defined by the filter type as well as its intrinsic coefficients, among other properties.

When channel conditions change, a new CHEST may be selected. Various embodiments of the present disclosure address effectively transitioning between a previous selected CHEST and an updated CHEST. Without properly addressing an effective transitioning scheme, instability of the output signal may occur. Accordingly, some embodiments of the present disclosure allow for fast switching between CHESTS in a manner that does not require the output of a selected CHEST to be frozen during the time it takes to transition between two CHESTS.

In various embodiments of the present disclosure, the intrinsic coefficients of each of the plurality of available CHESTS are normalized. That is to say, intrinsic coefficients are scaled to allow for coefficient normalization. Furthermore, various embodiments address sharing input history data between CHESTS. In this respect, an updated CHEST may leverage the filter history data of a previous CHEST to effectuate a fast transition. This is achieved, in part, by normalizing each CHEST with scaled coefficients.

Figure 1:
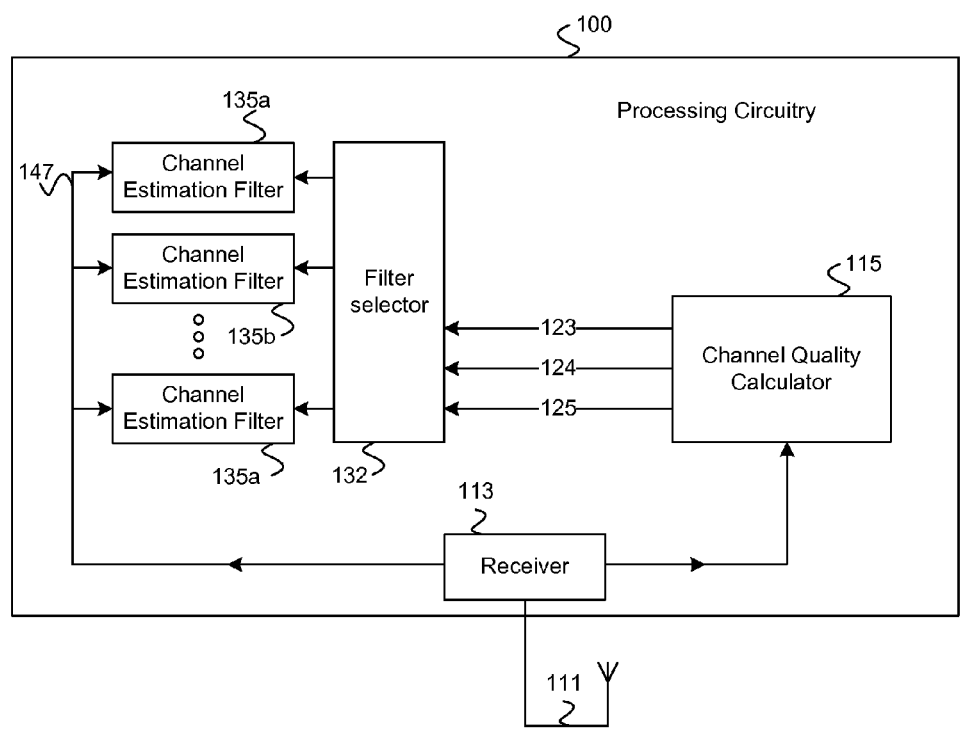
FIG. 1 is a drawing of an example of processing circuitry for implementing at least a portion of a wireless communication system, in accordance with various embodiments of the present disclosure.

FIG. 1 is a drawing of an example of processing circuitry for implementing at least a portion of a wireless communication system, in accordance with various embodiments of the present disclosure. Referring to FIG. 1, there is shown processing circuitry 100. In various embodiments, the processing circuitry 100 is implemented as at least a portion of a microprocessor. The processing circuitry 100 may include one or more circuits, one or more microprocessors, or any combination thereof. In yet other embodiments, processing circuitry 100 may include one or more software modules executable within one or more processing circuits.

The processing circuitry 100 may include a receiver 113 coupled to one or more antennas 111 for receiving electromagnetic signals. Furthermore, the processing circuitry 100 may include a channel quality calculator 115 that determines various channel characteristics. In various embodiments, the channel quality calculator 115 generates one or more channel quality metrics 123-125 for determining an appropriate CHEST. An SNR level 123 is one example of a signal quality metric. A degree of Doppler shift 124 is an example of another signal quality metric. An antenna number 125 is yet another example of a signal quality metric. The antenna number 125 may refer to a particular antenna or a particular combination of antennas selected for receiving signals by a receiver 113. It should be understood that the present disclosure is not limited by the types of signal quality metrics discussed above.

The processing circuitry 100 further includes a filter selector 132 that receives one or more signal quality metrics 123-125. The processing circuitry 100 further includes a plurality of selectable CHESTs 135a-n. The filter selector 132 selects a CHEST 135a-n according to the received signal quality metrics 123-125.

An input signal 147 may be sent from the receiver 118 to each of the plurality of CHESTS 135a-n. In various embodiments, the input signal 147 is a digital signal encoded as an impulse train that reflects a sampled analog signal. In this respect the receiver 113 may include an analog to digital converter for transmitting a digital input signal to each of the CHESTS 135a-n.

Thus, as seen in the diagram of FIG. 1, the processing circuitry 100 may be configured to receive a wireless signal via one or more antennas 111, determine the channel characteristics of the received wireless signal, and select an appropriate CHEST 135a-n based on the determined channel characteristics. Accordingly, the functionality of the processing circuit 100 is used to implement at least a portion of a wireless communication device.

Each of the components of the processing circuitry 100 discussed above may be implemented as at least a portion of a microprocessor. Furthermore, each of the components discussed above may include one or more circuits and/or one or more microprocessors. In other embodiments, each of the components of the processing circuitry 100 may include one or more software modules executable within one or more processing circuits.

Figure 2A:
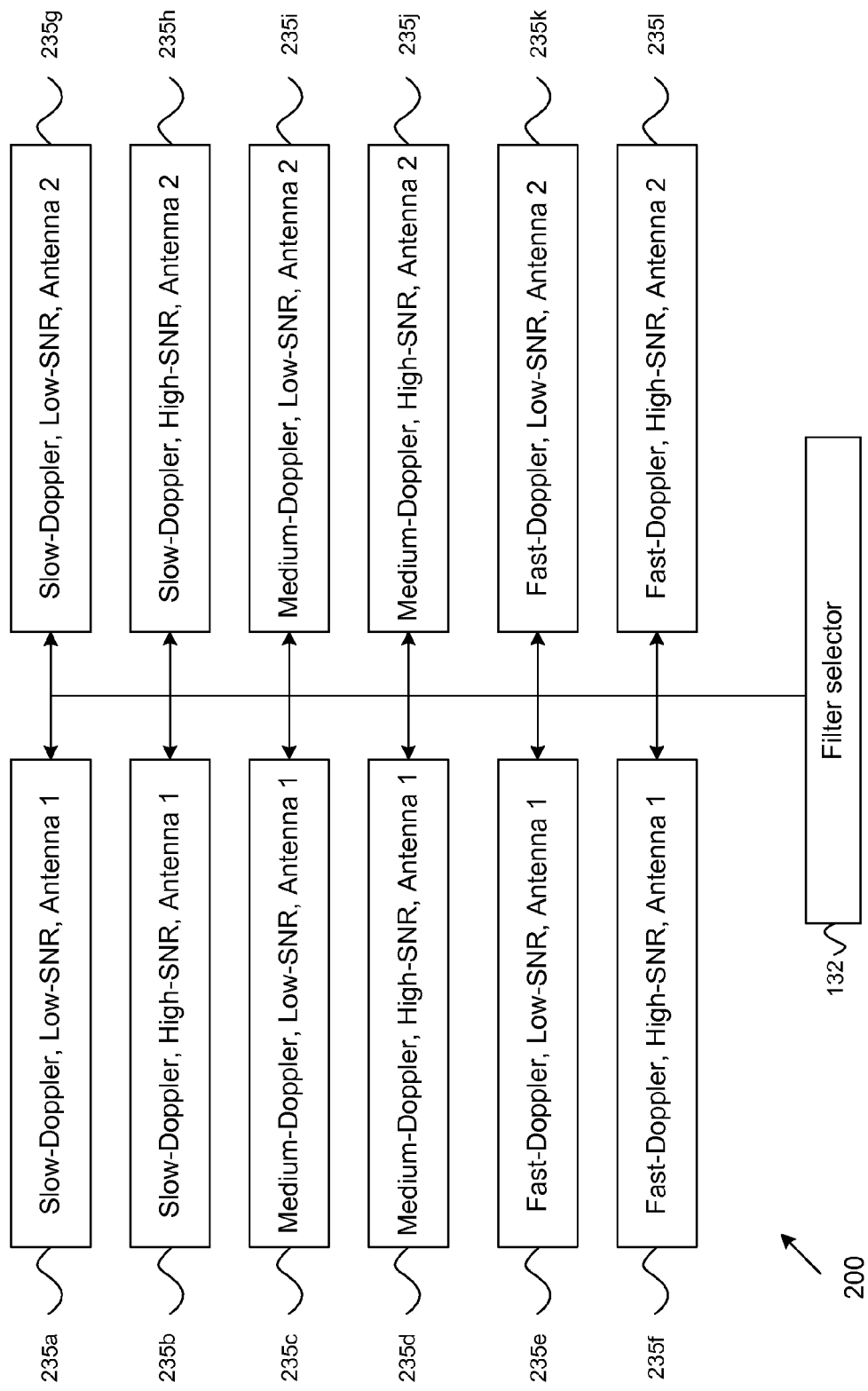
FIG. 2A is a diagram of an example of a plurality of channel estimation filters and a filter selector implemented in the processing circuitry of FIG. 1, in accordance with various embodiments.

FIG. 2A is a diagram of an example of a plurality of channel estimation filters and a filter selector implemented in the processing circuitry, in accordance with various embodiments. Referring to FIG. 2, there is shown a plurality of selectable CHESTS 200 which represent of a portion of processing circuitry 100 (FIG. 1). Specifically, FIG. 2 is an example of twelve CHESTS 235-a-l, each CHEST 235a-l may be selected by a filter selector 132. Each of the twelve CHESTS may be employed in the processing circuitry 100 in a manner described with regard to the CHESTS 135a-n of FIG. 1.

FIG. 2A provides an example of how various CHESTS 235a-l may be used to address a variety of difference channel conditions. In operation, for example, the filter selector 132 may receive a quantified degree of Doppler shift, a SNR level, and a selected antenna number. In various embodiments, the filter selector 132 may determine a category for the degree of Doppler shift. In the example of FIG. 2A, the filter selector 132 may categorize the degree of Doppler Shift as one of a plurality of finite categories, such as Slow-Doppler, Medium Doppler, and Fast Doppler.

A slow-Doppler may reflect a channel condition where the antenna or antennas 111 (FIG. 1) of a wireless communication device is not moving. For example, this can reflect a scenario where the user of a wireless device is sitting in her home. A medium-Doppler may reflect a channel condition where the antenna or antennas 111 are somewhat moving. For example, this can reflect a scenario where the user of a wireless device is walking down a street or driving a car in slow moving traffic. Finally, a Fast-Doppler may reflect a channel condition where the antenna or antennas 111 are rather quickly. For example, this can reflect a scenario where the user of a wireless device is in a train or a car on the highway. Based on the quantified Doppler shift, an appropriate operating regime is determined.

The SNR level may also be categorized into one of a plurality of finite categories. The filter selector 132 may determine, for example, whether the SNR level is low or high.

Moreover, the filter selector 132 may determine whether a first or second antenna is selected for reception. In this respect, each antenna 111 coupled to a wireless device that includes the processing circuitry 100 may exhibit different physical characteristics. Accordingly, the characteristics of the received signal may depend on the antenna used for receiving that signal.

Based on the metrics discussed above, the filter selector 132 selects one of the available twelve CHESTS 235a-l. In this respect, each CHEST is tailored to operate under specific channel conditions. For example, the intrinsic coefficients associated with a particular CHEST 235a-l and/or the type of filter used to implement the particular CHEST 235a-l determines how the CHEST 235a-l will operate. In the example of FIG. 2A, a fifth CHEST 235e has a particular filter type (e.g., FIR or IIR, etc.) and a particular set of intrinsic coefficients tailored for signals travelling over a channel characterized by a fast Doppler shift, a low SNR level, and antenna 1 use.

If, for example, the fifth CHEST 235e is selected and then subsequently, the SNR level of the channel significantly increase, then the sixth CHEST 235f may be selected by the filter selector 132. This results in a transition between a previously selected CHEST 235e and an updated CHEST 235f.

Figure 2B:
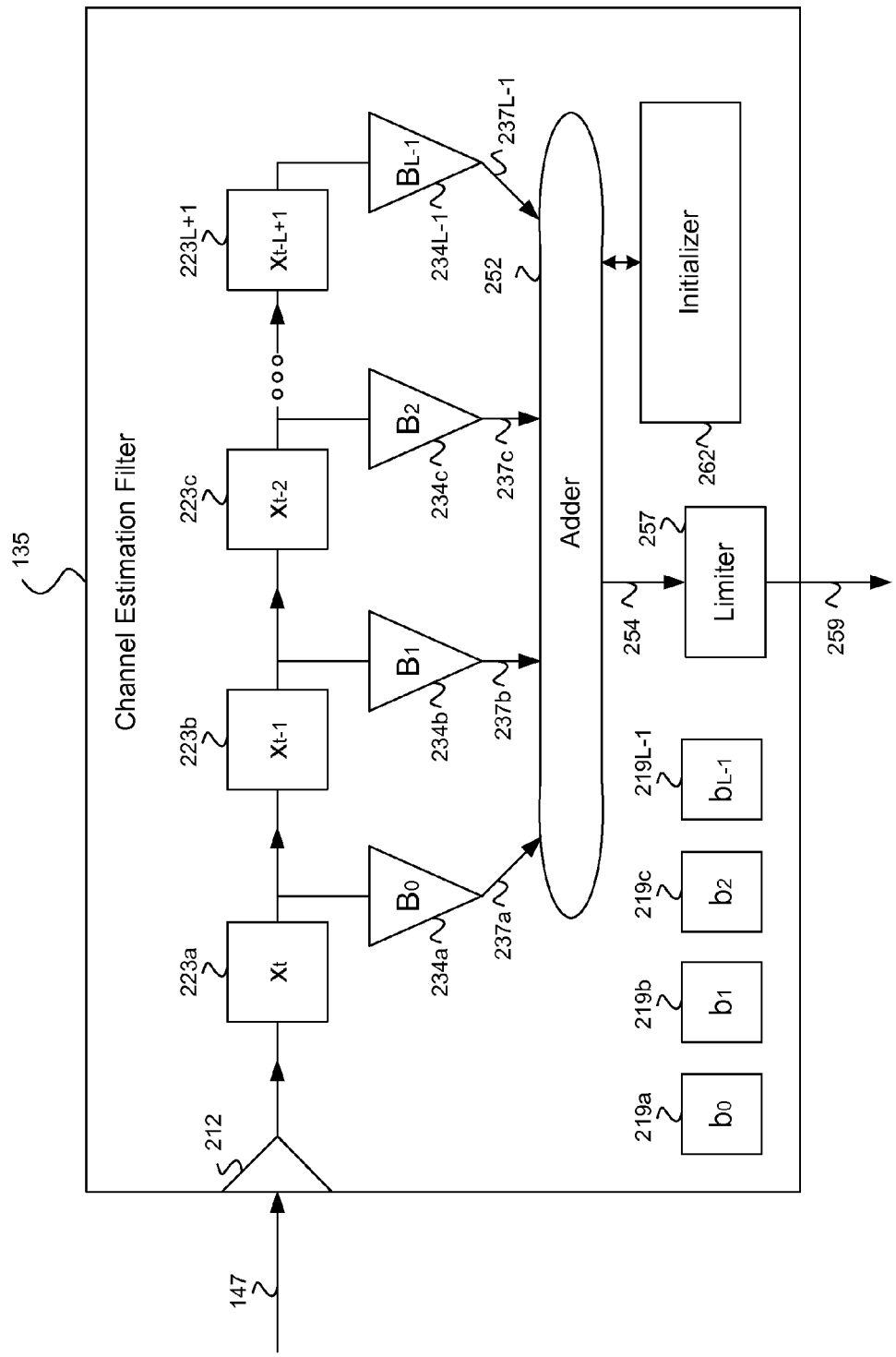
FIG. 2B is a diagram of an example of a channel estimation filter implemented in the processing circuitry of FIG. 1, in accordance with various embodiments of the present disclosure.

FIG. 2B is a diagram of an example of a channel estimation filter implemented in the processing circuitry, in accordance with various embodiments of the present disclosure. Referring to FIG. 2B, there is shown an example of an implementation of a CHEST 135 receiving an input signal 147. The diagram of FIG. 2B is an example of at least a portion of any of the CHESTS 235a-l of FIG. 2A and/or any of the CHESTS 135a-n discussed in FIG. 1. Furthermore, the CHEST 135 of FIG. 2B represents an example of the architecture of one CHEST among a plurality of CHESTS.

The CHEST 135 may be implements as different filter types. Some non-limiting examples of filter types are an FIR filter, an IIR DF1 filter, and an IIR DF2 filter. In various embodiments, an FIR filter is described by the following equation:

$$y[n]=x[n]b[0]+x[n-1]b[1]+\ldots +x[n-L+1]b[L-1]$$

In the equation above, "n" represents discrete points in time. The variable "y" represents the output of the FIR filter, "x" represents an input signal with various time components, and the coefficients of the FIR filter are represented by b[k], k=0 . . . L−1, where L is the number of coefficients.

In various embodiments, an IIR DF1 filter is described by the following equation:

$$y[n]=x[n]b[0]+\ldots x[n-L+1]b[L-1]-y[n-1]a[1]-\ldots -y[n-K+1]a[K-1]$$

In the equation above, "n" represents discrete points in time. The variable, "y" represents the output of the IIR DF1 filter, "x" represents an input signal with various time components. The denominator coefficients of the IIR DF1 filter are represented by a[k], k=0 . . . K−1, where K is the number of denominator coefficients and the numerator coefficients are represented as b[l], l=0 . . . L−1, where L is the number of numerator coefficients. Stability requires a[0]=1 and L<K.

In various embodiments, an IIR DF2 filter is described by the following equations:

$$v[n]=x[n]-v[n-1]a[1]-\ldots -v[n-K+1]a[K-1]$$

$$y[n]=v[n]b[0]+v[n-1]b[1]+\ldots +b[n-L+1]a[L-1]$$

In the equation above, "n" represents discrete points in time. The variable, "y" represents the output of the IIR DF1 filter, "v" represents an intermediate variable, and "x" represents an input signal with various time components. The denominator coefficients of the IIR DF1 filter are represented by a[k], k=0 ... K−1, where K is the number of denominator coefficients and the numerator coefficients are represented as b[l], l=0 ... L−1, where L is the number of coefficients. Stability requires a[0]=1 and L<K.

In various embodiments, the CHEST 135 includes an input terminal 212 for receiving an input signal 147. The CHEST 135 includes one or more time blocks 223a-223L+1 for queuing various components of the input signal 147. Time blocks store state information of an input signal 147. In this respect the input signal 147 may be made up of a plurality of sequential time samples. Accordingly, each time block 223a-223L+1 is configured to queue a different time sample of the input signal. For example, the first time block 223a queues the most recent time sample $X_t$ and the second time block 223b queues the immediately preceding time sample $X_{t-1}$.

Additionally, in various embodiments, the CHEST 135 includes intrinsic coefficients 219a-219L−1. In one embodiment, among others, intrinsic coefficients 219a-219L−1 are stored in memory. Intrinsic coefficients 219a-219L−1 define the operation of the CHEST 135. Depending on whether a CHEST 135 is configured for one set of channel conditions or another, these intrinsic coefficients 219a-219L−1 vary accordingly. In this respect, intrinsic coefficients 219a-219L−1 are predetermined for configuring the CHEST 135. In various embodiments, intrinsic coefficients 219a-219L−1 are static values that fix the operation conditions of the CHEST 135.

Furthermore, the CHEST 135 may include scaled coefficients 234a-234L−1. Scaled coefficients 234a-234L−1 are calculated based on corresponding intrinsic coefficients 219a-219L−1. That is to say, a first scaled coefficient 234a is based on a corresponding first intrinsic coefficient 219a. Scaled coefficients 234a-234L−1 allow for efficient transition between a previously selected CHEST and an updated CHEST, as is discussed in further detail below.

In various embodiments, the CHEST 135 generates a plurality of multiplication products 237a-237L−1. Each multiplication product 237a-237L−1 is a result generated based on a multiplication of a respective input signal component and a respective coefficient. For example, a first multiplication product 237a may be generated by multiplying a first operand being a coefficient 234a and a second operand being a sample of the input signal 147, $X_t$.

Additionally, the CHEST 135 may include an adder 252 to combine each of the multiplication products 237a-237L−1. For example, the adder 252 may employ a summing operation to add each of the multiplication products 237a-237L−1 to generate a combined output 254. The combined output 254 may be represented as the following expression:

$$x_t * B_0 + x_{t-1} * B_1 + x_{t-2} * B_2$$

In various embodiments, the CHEST 135 includes a limiter 257 to limit the magnitude of the output 259 of the CHEST. In one aspect of the present disclosure, the limiter 257 limits the magnitude of the output 259 of the CHEST 135 by employing a saturation function to the combined output 254 of the adder 252. A saturation function limits an input to one extreme or another extreme of a predetermined range if the input exceeds the predetermined range. For example, if the saturation function is configured to limit inputs to a range of −128 to 127, inputs less than −128 (e.g., −129, −130, −256, etc.) are saturated to a value of −128. Similarly, inputs greater than 127 (e.g., 128, 130, 203, etc.) are saturated to a value of 127. Inputs within the range of −128 to 127, inclusively, remain unaffected by the saturation operation. In another aspect, the limiter 257 may alternatively employ a bit shift operation to effectively divide an input in order to reduce the magnitude of the output.

Furthermore, in various embodiments, the CHEST 135 includes an initializer 262. The initializer 262 may initialize the CHEST 135 with input history of a previously selected filter. Input history, for example, may include one or more multiplication products 237a-237L−1 of a previously selected CHEST. In this respect, when an updated CHEST 135 is selected, the updated CHEST 135 may be loaded with data generated by the previously selected filter, the data relating to computations based on previous samples of the input signal 147.

Without initializing the updated CHEST 135, a substantial delay may occur or may be forced to occur such that the updated CHEST may experience latency caused by a calculation multiplication products. However, by using an initializer 262, multiplication products 237a-237L−1 calculated by a previously selected CHEST may be loaded directly into the updated CHEST 135.

Next is a description of description of the relationship between the intrinsic coefficients 219a-L−1 and scaled coefficients 234a-234L−1 according to various embodiments of the present disclosure. By using scaled coefficients 234a-234L−1 based on a scaling of intrinsic coefficients 219a-219L−1, sets of coefficients for each of a plurality of CHESTS are effectively normalized. For example, in FIG. 1, the plurality of CHESTS 135a-n may have corresponding sets of scaled coefficients such that history data may be shared between the different CHESTs 135a-n. In other embodiments, intrinsic coefficients 219a-219L−1 are scaled using shifters to perform a scaling operation. Ultimately, scaled coefficients facilitate better transitioning between CHESTs when channel conditions change.

A CHEST 135 includes a set of multipliers to multiply each coefficient with a corresponding component of an input signal 147. In various embodiments, these multipliers have physical limitations on the bit size for each operand. For example, a multiplier implemented by the CHEST 135 to multiply $X_t$ and $B_0$ may be a 16 bit multiplier. That is to say, the multiplier accepts a first operand no larger than 16 bits and a second operand no larger than 16 bits to generate a multiplication product 237a-237L−1. In various embodiments, a scaled coefficient 234a-234L−1 is derived from a corresponding intrinsic coefficient 219a-219L−1 based on a bit length of the multiplication circuitry operand. For example, let N be the bit size of the multiplication circuitry operand and let $b_0$ be the intrinsic coefficient 219a. To calculate a corresponding scaled coefficient 234a ($B_0$) based on scaling the intrinsic coefficient 219, the following equations may be used:

$$B_0 = scale_{b0} * b0$$

$$scale_{b0} = \text{floor}\left(\log_2\left(\frac{2^N}{b_0}\right)\right)$$

In this respect, a scaled coefficient 234a (e.g., $B_0$, etc.) is calculated based on a corresponding intrinsic coefficient 219a (e.g., $b_0$, etc.) and the bit length of the multiplication circuitry operand. In some embodiments, a floor function can be used to calculate the scaled coefficient 234a-234L−1.

By scaling each intrinsic coefficient 219a-219L−1, the various sets of intrinsic coefficients associated with each of the plurality of CHESTS 135a-n (FIG. 1) are normalized and contained within a particular range. This particular range is determined based on the operand bit size of a multiplier.

In various embodiments, the intrinsic coefficient 219a-219L-1 is scaled such that a corresponding scaled coefficient 234-234L-1 is encoded in a 2's complement format. Accordingly, each scaled coefficient 234-234L-1 is calculated such that the scaled coefficient 234-234L-1 falls in a range according to the following expression:

$$[-2^N, 2^N-1]$$

Thus, as seen above, various quantization rules may be applied to the intrinsic coefficients 219a-219L-1 to calculate corresponding scaled coefficients 234-234L-1. The constraint on multiplier sizes can be used to scale the intrinsic coefficients 219a-219L-1 accordingly. When filters are designed using high-level tools such as, for example Matlab or mathematical templates such as Elliptic, Butterworth floating-point coefficients are the output. Implementation in digital hardware or programmable digital signal processing may require fixed-point coefficients. In various embodiments, coefficients may be limited to a range of $[-2^{N1}, 2^{N1}-1]$ where ^ stands for exponentiation and where N1 is positive integer representing the size of a coefficient operand of a multiplier. Also, input signals 147 may be limited to a range of $[-2^{S1}, 2^{S1}-1]$, where S1 is positive integer representing the size of an input signal operand of a multiplier. Similarly, limits may be placed on coefficients that are denominator coefficients, numerator coefficients, denominator input signals, and numerator input signals.

The following provides non-limiting examples of quantization rules for scaling coefficients according to constraints on multiplier sizes.

1) Each numerator coefficient b[i] is scaled by floor(log 2($2^{N1}$/b[i]))=num_scl to give B[i], where "b" is an intrinsic coefficient, "B" is the scale coefficient, num_scl is the scale factor amount, and N1 is positive integer representing the size of a numerator coefficient operand of a multiplier.

2) The signal entering numerator multipliers must be limited to $[-2^{S1}, 2^{S1}-1]$ under all possible input conditions], where S1 is positive integer representing the size of an input signal operand of a multiplier for the numerator coefficients.

3) Each denominator coefficient a[i] is scaled by floor(log 2($2^{D1}$/a[i]))=den_scl to give A[i], where "a" is an intrinsic coefficient, "B" is the scale coefficient, den_scl is the scale factor amount, and D1 is positive integer representing the size of a denominator coefficient operand of a multiplier.

4) The signal entering denominator multiplier is determined by the state-variables of the filter.

These may also be limited to $[-2^{S2}, 2^{S2}-1]$, where S2 is positive integer representing the size of an input signal operand of a multiplier for the denominator coefficients.

5) If the largest input signal causes clipping at internal filter node due to nature of impulse-response then, parameter x_scl is used to reduce maximum amplitude at internal node.

6) The scaling of denominator coefficients may be split into two components, den_scl1, den_scl2, where the two components equate to the overall scaling of the denominator coefficients, den_scl.

This may not affect filter transfer function. In this respect, the denominator coefficients are scaled at two different signal paths, as is discussed in further detail below.

Figures 3A, 3B:
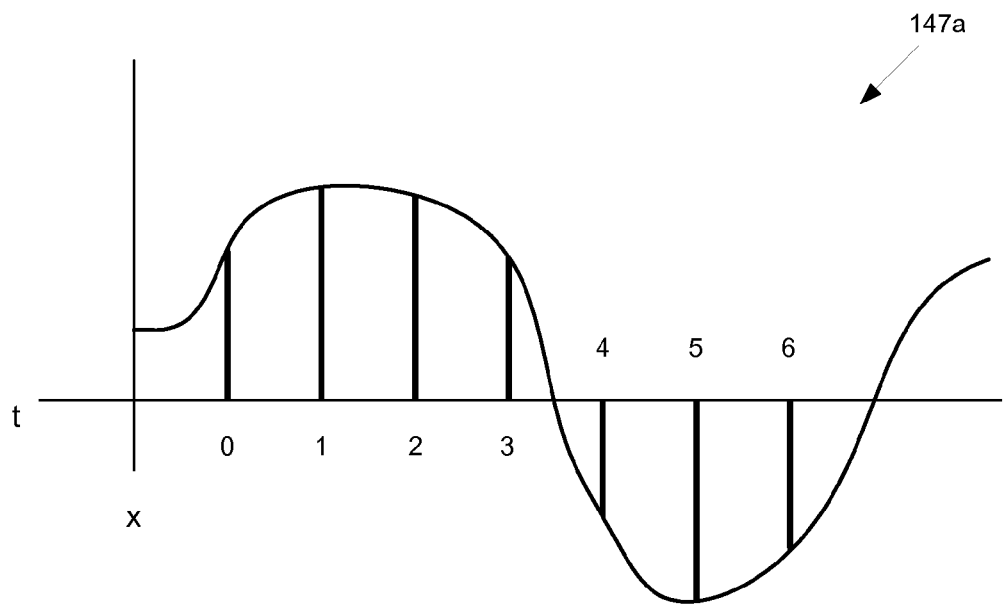
FIGS. 3A & 3B are diagrams of examples of an input signal processed in the processing circuitry of FIG. 1, in accordance with various embodiments of the present disclosure.

Next, FIG. 3A is a diagram of an example of an input signal processed in the processing circuitry, in accordance with various embodiments of the present disclosure. Shown in FIG. 3A is an input signal 147a. The input signal 147a is sampled at various points based on a sampling rate at discrete points in time.

Moving to FIG. 3B, FIG. 3B is a diagram of an example of an input signal processed in the processing circuitry, in accordance with various embodiments of the present disclosure. Shown in FIG. 3B is an input signal 147a presented in a digital format. At various points in time, t, $x_t$ represents an amplitude and/or magnitude of the input signal 147a.

Figure 3C:
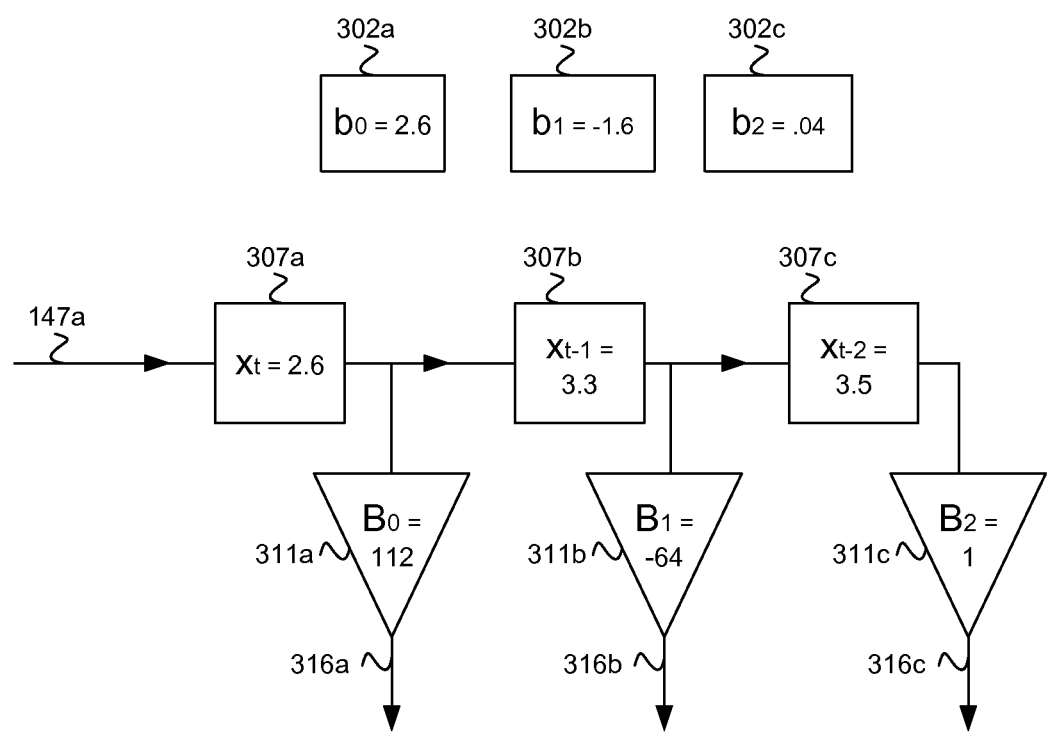
FIG. 3C is a diagram of an example of a channel estimation filter processing an input signal in the processing circuitry of FIG. 1, in accordance with various embodiments of the present disclosure.

Now turning to FIG. 3C, FIG. 3C is a diagram of an example of a channel estimation filter processing an input signal, in accordance with various embodiments of the present disclosure. FIG. 3C depicts an example of a portion of a CHEST 335 processing the input signal 147 described in FIGS. 3A & 3B. In this example, the CHEST 335 represents a portion of one of the CHESTs 135a-n of FIG. 1 of the CHESTs of 235a-l of FIG. 2. Thus, the CHEST may be implemented as a portion of the processing circuitry 100 (FIG. 1).

As seen in FIG. 3C, the CHEST 335 is associated with three intrinsic coefficients 302a-c. Furthermore, the CHEST 335 if FIG. 3C includes three scaled coefficients 311a-c such that the scaled coefficients 311a-c are derived from the three intrinsic coefficients 302a-c, respectively. In addition, the CHEST 335 includes three time blocks 307a-c to process the various samples of the input signal 147a. Specifically, in this example, the CHEST 335 is configured to analyze the current input signal component $x_t$ and the two immediately preceding components, $x_{t-1}$ and $x_{t-2}$. It should be noted that in this example, the length of the filter is 3. For each scaled coefficient 311a-c, the CHEST 335 includes a multiplier for generating a corresponding multiplication product 316a-c. The first multiplication product 316a is represented as the following expression:

$$x_t * B_0.$$

In operation, the CHEST 335 uses scaled coefficients 311a-c based on a scaling of corresponding intrinsic coefficients 302a-c and based on the operand bit size of the multiplier. In this example, the operand bit size of the multiplier is 8 bits. Accordingly, the range of acceptable values, in a 2's complement format, is [-128, 127]. Thus, each intrinsic coefficient 302a-c is scaled to fit within this range. In this example, each intrinsic coefficient 302a-c is scaled by 40 to generate corresponding scaled coefficients 311-a-c.

Furthermore, in FIG. 3C, the CHEST 335 may be configured to be initialized according to an initializer 262, as discussed with respect to FIG. 2B. In one example, the CHEST 335 of FIG. 3C is an updated CHEST. That is to say, channel conditions triggered the CHEST 335 of FIG. 3C to be newly selected. To initialize this CHEST 335, the input history of the previously selected CHEST is loaded by the processing circuitry 100 into the updated CHEST 335. This input history includes, for example, a multiplication product of a scaled coefficient of the previously selected CHEST and the past time sample of the input signal. So, if the updated CHEST 335 is selected at t=3, then a past time sample can be the amplitude of the input signal at t=2 or t=1, etc.

If the number of coefficients associated with the previously selected CHEST is less than the number of coefficients associated with the updated CHEST 335, then the processing circuitry 100 may duplicate portions of the input history of the previously selected CHEST. For example, the processing circuitry 100 may duplicate the multiplication products associated with the least recent components of the input signal. To this end, when processing circuitry 100 causes a transition from a simple CHEST to a more complicated CHEST, a more complicated CHEST being one associated with more coefficients, then input history loaded from the simple CHEST may be duplicated or otherwise fabricated to fully load the more complicated CHEST. Similarly, when transitioning from a more complicated CHEST to a simpler CHEST, then input history loaded from the more complicated CHEST may be truncated. By sharing input history data between a previously selected CHEST and an updated CHEST 335, a more efficient transition may be achieved. Furthermore, by using scaled coefficients that are normalized across the plurality of CHESTs, it is possible to transition from an FIR to an FIR, an FIR to an IIR, an IIR to an IIR, and an IIR to an FIR.

In various embodiments, when the transition is an FIR to an FIR, the input history is adjusted to account for possibly different optimum-quantization parameters of the two filters. If L'>L then, oldest available input is x[t1−L+1]. In this example, "L" is the length of the previously selected CHEST and "L'" is the length of the updated CHEST. Therefore, older inputs are initialized according to the following equation:

$$x[t1-L'+1]=\ldots x[t1-L]=x[t1-L+1]$$

Note that the prime (') character represents variables associated with the updated CHEST.

In various embodiments, when the transition is an FIR to an IIR, the IIR filter requires past outputs whereas the FIR does not. The updated IIR is initialized according to the following equation:

$$y[t1-K'+1]=y[t1-K'+2]=\ldots y[t1-1]$$

As seen above, "K'" is the number of denominator coefficients and "L'" is the number of numerator coefficients of the updated CHEST. The IIR accounts for the possibly different optimum scaling. The input history is available in the FIR filter and it is used for the IIR filter accordingly. If L'>L then, oldest available input is x[t1−L+1]. Therefore, older inputs are initialized similarly as the case of transitioning from an FIR to an FIR.

In various embodiments, when the transition is an IIR to an IIR, the input and output histories are adjusted to account for different optimum-quantization parameters of the two filters. If L'>L the oldest available input is x[t1−L+1]. Older inputs are initialized in a manner similarly to that of an FIR to FIR transition.

If K'>K then, the oldest available output is y[t1−K+1]. Accordingly, older outputs are initialized as y[t1−K'+1]= . . . y[t1−K]=y[t1−K'+1] after accounting for possibly different optimum scaling. The initialization depends on quantization parameters of the previously selected CHEST and the updated CHEST.

The input history of a node of a CHEST is "h[n]". Internal summer node variables may be denoted as s[n]. The following equations characterize the input history used to initialize the updated IIR:

$$h[n]=s[n]/2^{den\_scl}$$

$$h'[n]=s'[n]/2^{den\_scl'}$$

$$h'[n]2^{den\_scl'}/2^{num\_scl'}=h[n]2^{den\_scl}/2^{num\_scl}$$

$$y[n]=s[n]/2^{num\_scl}$$

$$y'[n]=s'[n]/2^{num\_scl'}$$

Accordingly, to ensure a smooth transition of the output of the updated IIR, the following equation may be used:

$$h'[n]2^{den\_scl'}/2^{num\_scl'}=h[n]2^{den\_scl}/2^{num\_scl}$$

With reference to the previously selected IIR and the updated IIR, the previously selected IIR may be characterized by the parameters {a[i], b[j], L, K, num_scl, x_scl, den_scl} and the updated IIR may be characterized by the parameters {a'[i], b'[j], L', K', num_scl', den_scl', x_scl'}. At a discrete time, t1, the appropriate coefficient scaling that may be used to mitigate discontinuity and long-duration transient is expressed in the following equation:

$$h'[t1-i]=h[t1-i]2^{(den\_scl-den\_scl')}2^{(num\_scl'-num\_scl)}$$

In various embodiments, when the transitioning from an IIR to an FIR, the FIR filter does not require an output of the previously selected IIR filter. The input history is available in the IIR filter and it is used as-is after accounting for possibly different optimum scaling. Unavailable older inputs may be initialized in a manner similar to the case of an IIR to IIR transition.

Figure 4:
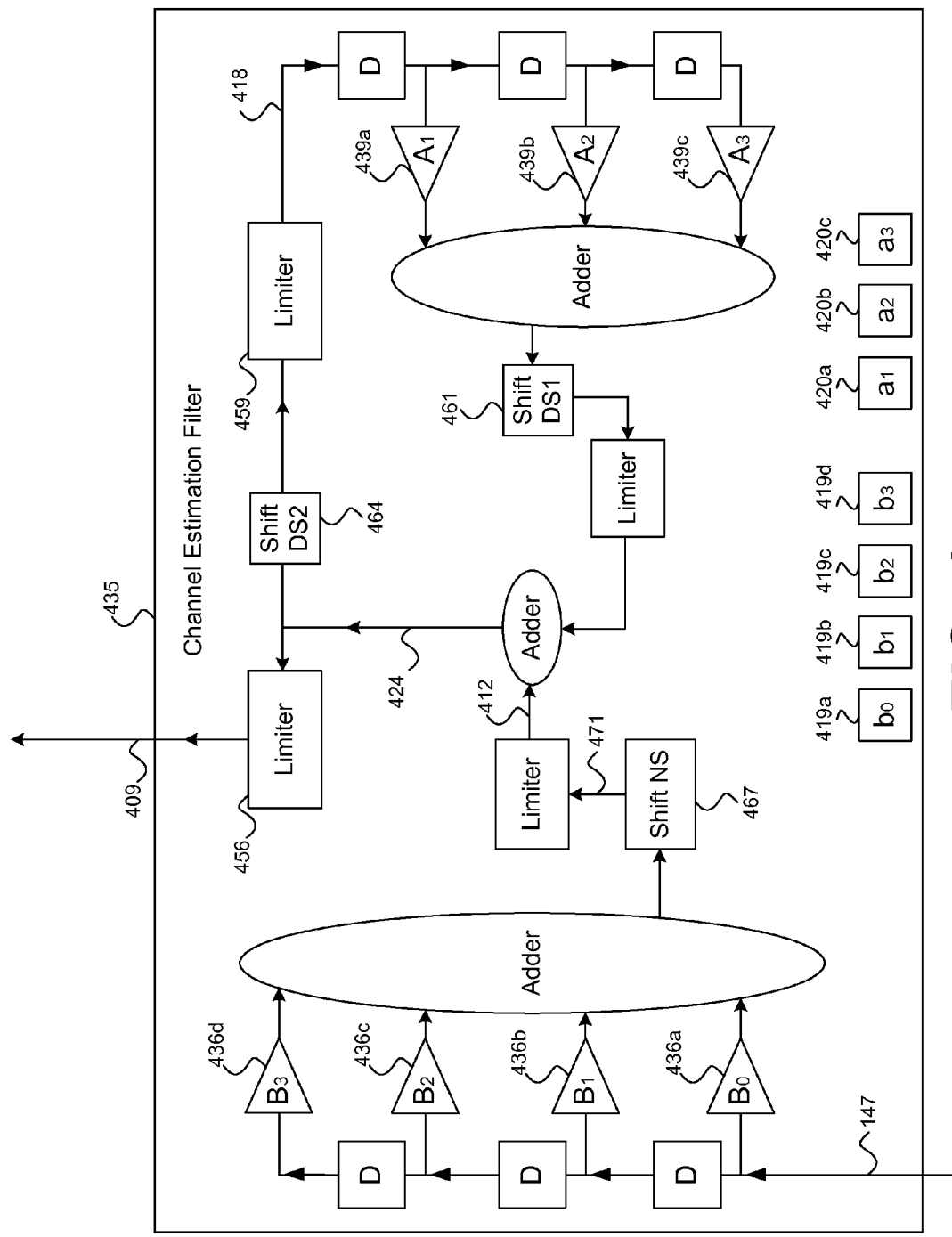
FIG. 4 is a diagram of an example of a channel estimation filter implemented in the processing circuitry of FIG. 1, in accordance with various embodiments of the present disclosure.

Next, FIG. 4 is a diagram of an example of a channel estimation filter implemented in the processing circuitry, in accordance with various embodiments of the present disclosure. FIG. 4 may be implemented as a portion of any of the CHESTs 135*a-n* discussed in FIG. 1 or the CHESTs 235*a-l* discussed in FIG. 2. Specifically, FIG. 4 is a representation of a CHEST 435 using an IIR. The CHEST 435 processes an input signal 147 to generate a limited output signal 409. The CHEST 435 includes numerator coefficients 436*a-d* and denominator coefficients 439*a-c*. Each of these coefficients 436*a-d* & 439*a-c* are intrinsic coefficients 419*a-d* & 420*a-c* that are subject to scaling by one or more shifters 461, 464, 467. As seen in FIG. 4, respective components of the input signal 147 are multiplied with respective numerator coefficients 436*a-d* to generate corresponding numerator components. These numerator components are combined using an adder. The adder may be implemented in a manner described with respect to the adder 252 of FIG. 2B. The combined numerator components may then be subject to scaling according to the various embodiments of the present disclosure. The scaling may be performed by a numerator shifter 467 to generate a scaled numerator output 471. The scale amount may be denoted as "num_scl." The scaled numerator output may then be limited by a limiter to generate a limited numerator output 412. The limiter may be implemented in a manner described with respect to the limiter 257 of FIG. 2B.

Similarly, scaled denominator components may be generated based on multiplying denominator coefficients 439*a-c* with respective components of a feedback input signal 418. The denominator components may be combined to generate a denominator output. The denominator output may then be scaled by a first denominator shifter 461. The scale amount may be denoted as "den_scl1." The output of the first denominator shifter may then be limited and then combined with the limited numerator output to generate a total sum signal 424. The total sum signal 424 is limited by a limiter 456 that limits the magnitude of the signal to fit within a range, the range being determined by the bit size of the multiplier operand. The limited total sum signal is transmitted as the limited output 409. Additionally, the total sum signal may be limited by scaled by a second denominator shifter 464. The scale amount may be denoted as "den_scl2." The output of the second denominator shifter 464 may be limited by a limiter 459 to generate the feedback input signal 418.

The CHEST 435, which is implemented by an IIR, allows for scaling of the denominator components in a first branch with a first denominator shifter 461 and a second branch with a second denominator shifter 464. In this respect, by splitting the scaling of the denominator components into two branches, the CHEST 435 may handle larger denominator multiplication products while reducing the likelihood of having to limit the size of the denominator components.

Figure 5:
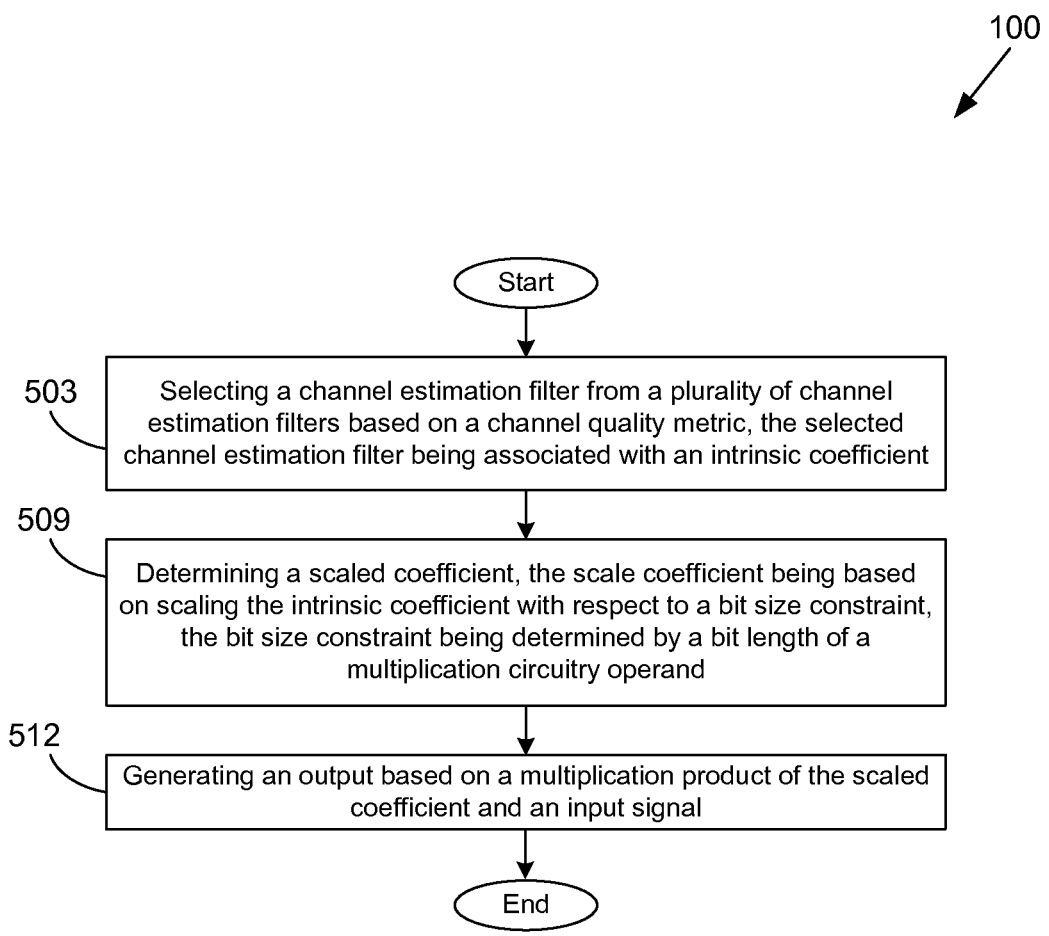
FIG. 5 is a flowchart illustrating examples of functionality implemented as portions of logic in the processing circuitry of FIG. 1 according to various embodiments of the present disclosure.

Referring next to FIG. 5, is a flowchart illustrating examples of functionality implemented as portions of logic in the processing circuitry 100 of FIG. 1 according to various embodiments of the present disclosure. It is understood that the flowchart of FIG. 5 provides merely an example of the many different types of functional arrangements that may be employed to implement the operation of the processing circuitry 100 as described herein. As an alternative, the flowchart of FIG. 5 may be viewed as depicting an example of steps of a method implemented in the processing circuitry 100 according to one or more embodiments.

To begin, processing circuitry 100 selects a channel estimation filter from a plurality of channel estimation filters 135a-n (FIG. 1) based on a channel quality metric 123-125 (FIG. 1), the selected channel estimation filter being associated with an intrinsic coefficient 219a-219L–1 (FIG. 2B), as seen in item 503. Any of the available CHESTs 135a-n may be implemented by an FIR or an IIR. Furthermore, a channel quality metric 123-125, for example, may be an SNR level, a degree of Doppler shift, a particular antenna, or any combination thereof. Based on an analysis of the one or more channel quality metrics 123-125, the most appropriate CHEST, among a plurality of available CHESTs 135a-n, is selected. The intrinsic coefficient 219a-219L–1 is a predetermined value used to optimize the selected CHEST to operate under specific conditions. In various embodiments, each of the plurality of channel estimation filters is associated with a respective set of static intrinsic coefficients such that each of the plurality of channel estimation filters are tailored to a respective set of channel conditions.

Next, the processing circuitry 100 determines a scaled coefficient 234a-234L–1 (FIG. 2B), the scaled coefficient 234a-234L–1 being based on scaling the intrinsic coefficient 219a-219L–1 with respect to a bit size constraint, the bit size constraint being determined by a bit length of a multiplication circuitry operand, as seen in item 509. In various embodiments, each set of intrinsic coefficients 219a-219L–1 associated with a respective CHEST 135a-n is scaled according to the physical limitations of multipliers employed by the various CHESTs 135a-n. To this end, all the coefficients used by the plurality of CHESTs, regardless of whether a particular CHEST 135a-n is implemented by an FIR or an IIR, are effectively normalized. That is to say, the processing circuitry 100 operates using normalized coefficients such that the coefficients are normalized across all available CHESTs 135a-n.

Accordingly, the processing circuitry 100 is configured to generate an output based on the scaled coefficient 234a-234L–1 and an input signal 147 (FIG. 1), as seen in item 512. In this respect, the processing circuitry 100 may employ multiplication circuitry to generate a multiplication product based on multiplying the scaled coefficient 234a-234L–1 with a respective component of the input signal 147.

In one embodiment, among others, the selected CHEST may be an IIR based on the functionality described in FIG. 4. In this case, the selected CHEST 435 (FIG. 4) may be associated with a set of scaled numerator coefficients 436a-d (FIG. 4) and a set of denominator coefficients 439a-c (FIG. 4). The processing circuitry 100 may generate a plurality of corresponding denominator components based on multiplications of each of the corresponding scaled denominator coefficients with respective portions of an input signal 418. Additionally, each of the scaled denominator outputs may be summed with one another to generate a scaled denominator output. The processing circuitry 100 may apply a limiter to limit the number of bits of the scaled denominator output. For example, the limiter may apply a bit shift operation to the scaled denominator output. Alternatively, the limiter may employ a saturation function to limit the magnitude of the scaled denominator output.

The flowchart of FIG. 5 shows the functionality and operation of an implementation of portions of processing circuitry 100. If embodied in software, each item may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such a the processing circuitry 100. The machine code may be converted from the source code, etc. If embodied in hardware, each item may represent a circuit or a number of interconnected circuits to implement the specified logical function(s).

Although the flowcharts of FIG. 5 show a specific order of execution, it is understood that the order of execution may differ from that which is depicted. For example, the order of execution of two or more blocks may be scrambled relative to the order shown. Also, two or more blocks shown in succession in FIG. 5 may be executed concurrently or with partial concurrence. Further, in some embodiments, one or more of the items shown in FIG. 5 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code, for example the processing circuitry 100 (FIG. 1), can be embodied in any non-transitory computer-readable medium for use by or in connection with an instruction execution system such as, for example, a processing circuitry 100 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles Therefore, at least the following is claimed:

1. A method for a processing circuit comprising:
selecting a channel estimation filter from a plurality of channel estimation filters based on a channel quality metric, the selected channel estimation filter being associated with an intrinsic coefficient, wherein a scaled coefficient of the selected channel estimation filter is based on scaling the intrinsic coefficient with respect to a bit size constraint, the bit size constraint being determined by a bit length of a multiplication circuitry operand;
initializing the selected channel estimation filter with input history of a previously selected channel estimation filter; and
generating an output based on the scaled coefficient and an input signal.

2. The method of claim 1, wherein the plurality of channel estimation filters comprises a finite impulse response filter and an infinite impulse response filter.

3. The method of claim 1, wherein the channel quality metric is at least one of a degree of Doppler shift, a signal to noise ratio level, or an antenna number.

4. The method of claim 1, wherein the selected channel estimation filter comprises a set of static coefficients, the selected channel estimation filter being tailored to a set of channel conditions.

5. The method of claim 1, wherein the selected channel estimation filter comprises an infinite impulse filter, wherein the selected channel estimation filter comprises a plurality of scaled denominator coefficients.

6. The method of claim 5, further comprising:
generating a plurality of corresponding denominator components based on multiplications of each of the corresponding scaled denominator coefficients with respective portions of the input signal; and
generating a scaled denominator output based on summing each of the corresponding denominator components with one another.

7. The method of claim 6, further comprising limiting the number of bits of the scaled denominator output.

8. The method of claim 7, wherein limiting comprises applying a bit shift operation to the scaled denominator output.

9. The method of claim 1, wherein the selected channel estimation filter comprises a plurality of scaled coefficients.

10. The method of claim 9, further comprising:
generating a plurality of corresponding scaled output components based on multiplications of each of the corresponding scaled coefficients with respective ones of plurality of sequential time samples of the input signal;
generating a scaled output based on a summing of each of the corresponding scaled output components with one another; and
limiting the magnitude of the scaled output by employing a saturation function.

11. A system for signal processing, comprising:
a plurality of filters, each filter associated with a respective normalized coefficient, each filter configured to generate a respective multiplication product based on a multiplication of the respective normalized coefficient and a past time sample of an input signal, the past time sample being one of a plurality of sequential time samples of the input signal;
circuitry configured to select an updated filter by selecting one of the plurality of filters based at least on a channel quality metric;
circuitry configured to identify a previously selected filter when the updated filter is selected; and
circuitry configured to initialize the updated filter with input history of the previously selected filter, the input history of the previously selected filter comprising a multiplication product of a normalized coefficient of the previously selected filter and the past time sample of the input signal.

12. The system of claim 11, wherein the circuitry configured to initialize the updated filter comprises circuitry configured to duplicate a portion of the input history of the previously selected filter when the number of coefficients associated with the previously selected filter is less than the number of coefficients associated with the updated filter.

13. The system of claim 11, wherein each respective normalized coefficient is encoded in a 2's complement format.

14. The system of claim 11, wherein each respective normalized coefficient is scaled according to a respective operand bit size of a corresponding multiplier.

15. The system of claim 14, wherein each respective normalized coefficient is derived from a corresponding intrinsic coefficient based on a floor function.

16. A system comprising:
processing circuitry, the processing circuitry comprising:
circuitry configured to select an updated channel estimation filter from a plurality of channel estimation filters based on a channel quality metric;
circuitry configured to identify a previously selected channel estimation filter,
wherein a plurality of coefficients of the updated channel estimation filter are normalized with respect to a plurality of coefficients of the previously selected channel estimation filter;
circuitry configured to initialize the updated channel estimation filter with input history of the previously selected channel estimation filter; and
circuitry configured to generate an output based on an input signal and based on the plurality of coefficients of the updated channel estimation filter.

17. The system of claim 16, wherein the input history of the previously selected channel estimation filter comprises a multiplication product of a coefficient of the previously selected filter and the past time sample of the input signal.

18. The system of claim 16, wherein the plurality of coefficients of the updated channel estimation filter are normalized with respect to the plurality of coefficients of the previously selected channel estimation filter according to a bit size constraint, the bit size constraint being determined by a bit length.

19. The system of claim 16, wherein the updated channel estimation filter comprises a finite impulse response filter and the previously selected channel estimation filter comprises an infinite impulse response filter.

20. The system of claim 16, wherein the circuitry configured to select the updated channel estimation filter based on the channel quality metric comprises circuitry configured to select the updated channel estimation filter according to at least one of a degree of Doppler shift or an antenna number.

* * * * *